United States Patent
Kahkoska et al.

(10) Patent No.: US 7,598,721 B2
(45) Date of Patent: Oct. 6, 2009

(54) LOCATING A CABLE USING SYNCHRONIZATION PORTION AND DATA PORTION OF A TONE PACKET OF A SYSTEM

(75) Inventors: James A. Kahkoska, Colorado Springs, CO (US); Thomas K Bohley, Colorado Springs, CO (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 11/775,163

(22) Filed: Jul. 9, 2007

(65) Prior Publication Data

US 2008/0012573 A1    Jan. 17, 2008

Related U.S. Application Data

(63) Continuation of application No. 10/699,617, filed on Oct. 30, 2003, now Pat. No. 7,242,178.

(60) Provisional application No. 60/507,909, filed on Sep. 30, 2003.

(51) Int. Cl.
*H03K 19/0175* (2006.01)
(52) U.S. Cl. .................. 324/66; 324/67; 324/158.1
(58) Field of Classification Search .................. None
See application file for complete search history.

(56) References Cited

U.S. PATENT DOCUMENTS

| | | | | |
|---|---|---|---|---|
| 3,891,811 A | * | 6/1975 | Miller | 324/66 |
| 4,393,491 A | * | 7/1983 | Ashlock et al. | 370/249 |
| 4,518,911 A | * | 5/1985 | Cass | 324/521 |
| 4,656,628 A | * | 4/1987 | Tan | 370/448 |
| 4,980,887 A | | 12/1990 | Dively et al. | |
| 5,025,466 A | | 6/1991 | Hilligoss et al. | |
| 5,077,731 A | | 12/1991 | Omiya | |
| 5,378,992 A | | 1/1995 | Murphy | |
| 5,548,820 A | * | 8/1996 | Victorin | 455/67.14 |
| 5,706,348 A | * | 1/1998 | Gray et al. | 713/160 |
| 5,812,557 A | * | 9/1998 | Stewart et al. | 714/712 |
| 5,894,223 A | | 4/1999 | Medelius et al. | |
| 5,914,608 A | | 6/1999 | Wissman et al. | |
| 6,445,773 B1 | * | 9/2002 | Liang et al. | 379/1.04 |
| 6,707,305 B2 | * | 3/2004 | Johnson et al. | 324/542 |
| 6,724,729 B1 | * | 4/2004 | Sikdar | 370/241 |
| 6,798,183 B2 | * | 9/2004 | Bohley et al. | 324/66 |
| 6,834,040 B2 | * | 12/2004 | Tomberlin | 370/241 |
| 7,012,891 B1 | * | 3/2006 | Chandran et al. | 370/230 |
| 7,127,041 B1 | * | 10/2006 | Houck | 379/25 |
| 7,242,178 B2 | * | 7/2007 | Kahkoska et al. | 324/158.1 |
| 2002/0044043 A1 | * | 4/2002 | Chaco et al. | 340/286.07 |

(Continued)

FOREIGN PATENT DOCUMENTS

EP        1370030 A2 *  12/2003

(Continued)

OTHER PUBLICATIONS

"Lan Toner Test Set" by Progressive Electronics, Sep. 2001 (two pages).*

(Continued)

*Primary Examiner*—Paresh Patel
(74) *Attorney, Agent, or Firm*—patenttm.us

(57) ABSTRACT

A digital toner/locator employs tone packets using a 455 Khz carrier. Plural packet quanta provide multiple test modes which are advantageously selected from a probe without requiring returning to the tone generator to change mode.

33 Claims, 5 Drawing Sheets

U.S. PATENT DOCUMENTS

2003/0090387 A1* 5/2003 Lestienne et al. ...... 340/825.49

FOREIGN PATENT DOCUMENTS

JP 2004048724 A * 2/2004

OTHER PUBLICATIONS

"200GX Inductive Amplifier" by Progressive Electronics, Aug. 2001 (six pages).*

"AT8L LAN Toner Test Set" by Progressive electronics, Sep. 2001 (12 pasges).*

77GX Professional GX Series Tone Generator advertisement, Jun. 24, 2003, (one page) http://www.lashen.com/vendors/tempo/toners$_{13}$ probes.asp, Lashen Electronics Advertisement.

* cited by examiner

| Sync1 | Sync2 | Version | Song# | NearCable | Mega12 | Mega36 | Mega45 | Mega78 | Wire1 | .... | Wire8 | Wire Sh | Quiet |

FIG. 2

LOCATING A CABLE USING SYNCHRONIZATION PORTION AND DATA PORTION OF A TONE PACKET OF A SYSTEM

BACKGROUND OF THE INVENTION

This invention relates to communication circuit testing and more particularly to an improved apparatus and method for providing and detecting tone for troubleshooting and tracing communications cabling.

In working on telecommunications cabling, a typical function involves identifying or locating a specific cable among a number of cables. For example, it may be desired to locate a cable at a distant end thereof relative to a junction point. In accordance with the prior art, a toner locating system is employed wherein an audio tone generator is connected at one position on the cable, and a detector or tone probe is employed elsewhere along the cable to detect the tone in an attempt to identify and isolate the cable carrying the tone from among other cables. This isolation attempt can be taking place far away from the tone generator location.

Some practical problems arise in use of such toner systems. The toner locater system was originally employed in telephone communication systems but is now also employed in computer networking situations. However, for example, a 100 megabit per second computer network employs common mode terminations, and existing toner devices do not work because the common mode termination configuration attenuates the tone. This results in the signal being too weak due to the termination by network equipment and it becomes difficult to detect it at a remote location.

Also, sometimes in particular wiring situations, the audio signal applied to the cable by the tone generator is too strong and causes crosstalk and bleed into other wires on a given cable or into other cables, making it difficult to determine which cable is the actual cable to which the audio signal is being applied. Especially with a 1 Khz signal applied to CAT5 cables, the coupling is strong and at a distance from the tone generator the signal strength on two adjacent cables can be similar so as to make it difficult to determine which is the cable of interest. These issues can lead to wasted time, either mis-identifying cable due to bleed, or to not being able to locate the cable due to a weak signal.

A certain level of experience is needed to effectively use such a toner system and to listen for the correct tone, as fluorescent lighting equipment, CRTs and other equipment which is typically present in most commercial buildings, can induce signals onto cabling which is then detected by the tone probe.

A typical prior art toner system, illustrated with reference to FIG. 5, employs a 1 Khz high power square wave generator 110 which applies the audio signal to the cable 112 under test. The generator 110 typically has two states, on or off. Some generators may have a further option of selecting the frequency of the square wave from among 2 or 3 fixed frequencies. The generator is connected to the cable under test via 2 clip leads 113 which allow connection to an individual wire or via a network connector 115. A hand held tone sensor probe 114, is a an amplifier, includes a sensor tip 116 and a speaker 118, and detects and converts the square wave to an audible 1 Khz tone (or tone of whatever the frequency is of the applied signal) audible through the speaker. The configuration of the toner probe can also result in feedback, since the tone probe tip will normally be highly sensitive and can detect and feedback signal from the speaker on the tone probe.

In use, the prior art tone generator is manually connected to the cable under test and is turned on, and the technician then takes the probe to the remote location, which can be far away, on a different floor in a building, for example. It can be that after setting the tone generator and moving to the remote location, the technician realizes that a different configuration may be required. For example, the technician may now wish to use two wires of a twisted pair in a cat5 cable as a single conductor to provider a stronger radiating signal on the cable, by connecting the tone generator appropriately. However, since the tone generator is far away, the technician must now travel back to the generator site and adjust the connection, then returning to the remote cable test site, consuming time.

SUMMARY OF THE INVENTION

In accordance with the invention, a cable locating system employs a test signal generator that produces multiple types of signaling to a cable under test and a sensor probe adapted to selectively track and report selected ones of the signaling types as chosen by a user.

Accordingly, it is an object of the present invention to provide an improved probe and toner type cable test system.

It is a further object of the present invention to provide an improved method of probe and toner testing for network cables.

It is yet another object of the present invention to provide an improved method and apparatus for cable location, isolation and identification tasks.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

FIG. 2 is a diagram illustrative of a tone packet configuration in accordance with the invention;

DETAILED DESCRIPTION

Figure 1:
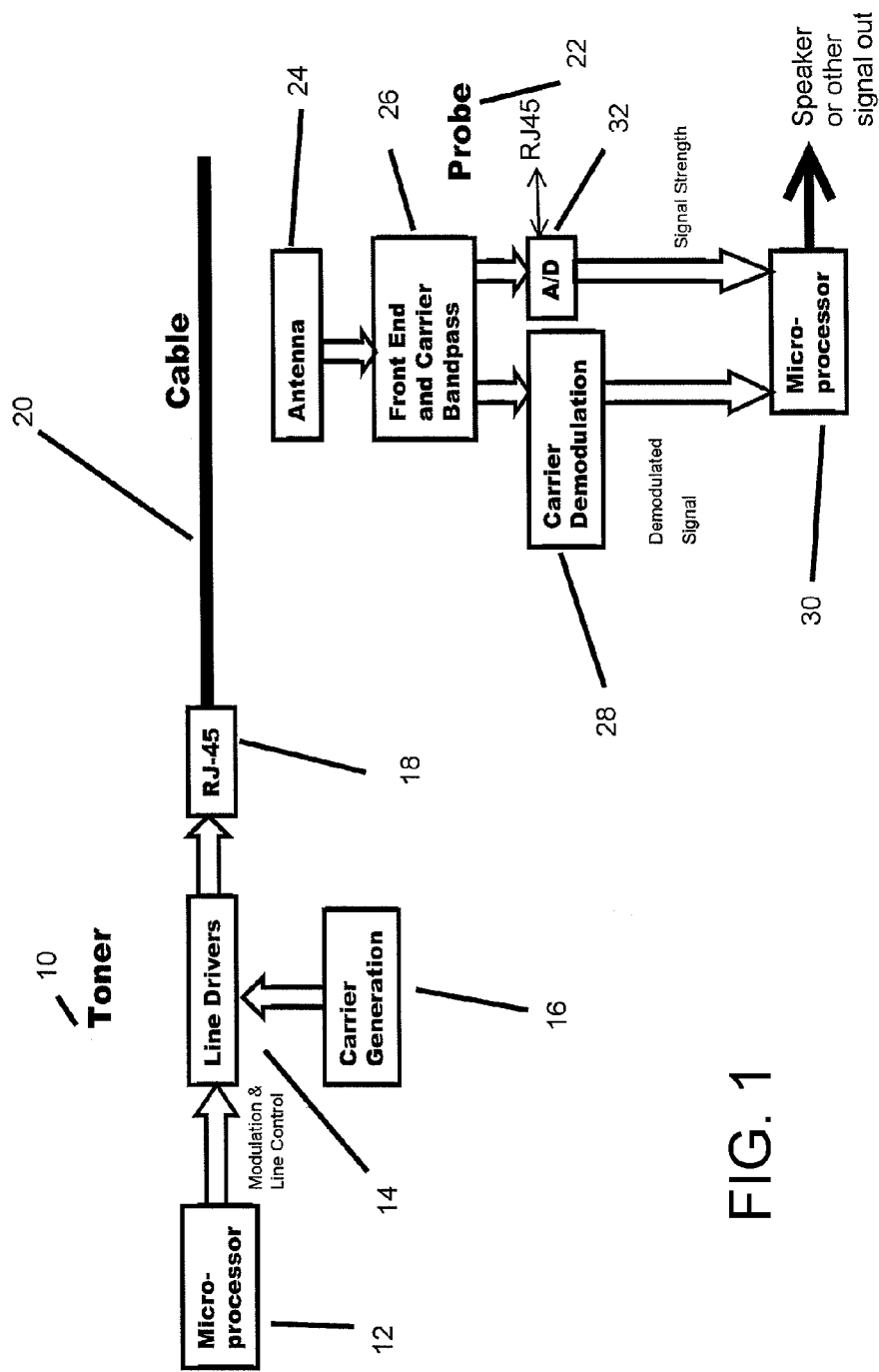
FIG. 1 is a block diagram of the toner and probe system in accordance with the invention.

Referring to FIG. 1, a block diagram of the toner and probe system, the toner device 10 comprises a microprocessor 12 supplying modulation and line control to line drivers 14, which suitably may be attached to a cable 20 via an appropriate connector such as an RJ45 connector provides carrier input in the case of a typical network. A carrier generation block 16 also provides input to the line drivers 14.

Separate from the toner 10, a probe 22 is positionable anywhere along the cable and comprises an antenna 24 which furnishes signals to front end and carrier bandpass block 26. Output from block 26 is fed to both carrier demodulation block 28 and analog to digital (A/D) converter block 32, and each of blocks 28 and 32 supply signals to a microprocessor 30. In the case of the carrier demodulation block 28, the microprocessor is given a demodulated signal for sync detection, while the A/D converter provides a signal strength value to the microprocessor.

The operation of the toner/probe system is accomplished differently from the prior art 1 Khz tone and probe type devices. Under control of the microprocessor 12, the toner carrier generation block provides a 455 Khz carrier. In order to provide a tone that can be detected even by prior art probes, the carrier is turned on and off at 1 Khz and 2 Khz rates. The 2 Khz rate is preferably employed during a sync phase discussed hereinbelow, and the 1 Khz modulation is employed at other times.

The probe 22 demodulates the 455 Khz carrier and measures the time intervals of the modulation. Signal strength is determined by A/D block 32 providing measurement of automatic gain control signal strength of the carrier. Suitably the toner may be configured to drive each conductor in a cable separately, for example In operation, the toner 10 generates a tone packet that includes various tone phases relative to a synchronization phase. Referring now to FIG. 2, a diagram of the configuration of a tone packet as employed in a preferred embodiment, plural quanta are provided as follows, each suitably comprising 10 milliseconds in a particular embodiment. First, two sync quanta, Sync1 and Sync2, are provided to accommodate synchronization of the probe to the tone packet. Sync1 suitably comprise modulation of the 455 Khz carrier at 2 Khz and presuming an 8 conductor (4 pair) cable, involves driving one conductor pair at one polarity, 2 other pairs with the opposite polarity and the $4^{th}$ pair is allowed to float (unbalanced). Sync2 floats conductor 2, drives conductors 3 and 4 positive and 5 and 6 negative.

Next, a Version quantum is provided which can be employed to indicate a particular feature. For example, in the preferred embodiment, the presence of any energy during the Version quanta indicates a wiremap operation is enabled and wiremap quantas (discussed hereinbelow) will be present. After Version, a Song# quantum indicates which "song" the probe is to employ for example when producing an audible alert for the technician indicating signal detection. This feature can be advantageous when more than one person is working at locating a cable at the same time in the same area, so that a first technician's "tone" is not detected by a second technician in error, leading the second technician to misidentify the cable, thinking it is the second technician's tone that has been applied to the cable.

Now, a NearCable quantum is provided. The near cable phase is designed to provide minimum radiation from the cable, to minimize bleed with other cables and allow the user to precisely identify the toned cable. This phase employs the normal properties of the twisted pair cables pairs, driving opposite polarity on each of the pair wires (e.g., wires 1, 3, 4 and 7 could be driven positive, while wires 2, 5, 6 and 8 were driven negative).

Next, 4 "mega" phases are generated, Mega12, Mega36, Mega45 and Mega78, which produce maximum signal radiation from the cables by applying unbalanced signals of one polarity on each designated pair during the 4 phases, applying an opposite polarity signal on 2 of the other pairs and allowing the last pair to float. It has been determined by the inventors that employing this manner of signal application provides a better signal. That is, during Mega12 phase, the unbalanced signal is on pair 1, 2, while an opposite polarity signal is applied to 2 other pairs and a $4^{th}$ pair is floated. During Mega36 phase, the unbalanced signal is on pair 3, 6, etc. Both wires of the particular pair are driven with the same polarity. In the particular embodiment illustrated herein, the probe is taking signal strength measurements during these Mega phases, and is configured to sample 4 readings in any particular quantum and use the maximum level measured during the particular phases as a signal strength value for this particular tone packet.

Wiremap quanta, Wire1, Wire2, Wire3, Wire4, Wire5, Wire6, Wire7, Wire8 and WireSh are now optionally present if the Version quanta so indicated. In the wire map phase, all the cable wires are terminated and a "1" value is applied to each of the respective lines during the respective phase. That is, during the Wire1 quantum, the "1" is applied to wire 1, during Wire2 quantum, the "1" is applied to wire 2, during Wire3 quantum, the "1" is applied to wire 3, during Wire4 quantum, the "1" is applied to wire 4, during Wire5 quantum, the "1" is applied to wire 5, during Wire6 quantum, the "1" is applied to wire 6, during Wire7 quantum, the "1" is applied to wire 7, during Wire8 quantum, the "1" is applied to wire 8, and during WireSh, the "1" is applied to the cable shield (in the case of an 8 conductor single shield cable configuration). During the wiremap quanta, the energy applied to the wires is a voltage level rather than the 455 Khz carrier, the intention of this being to eliminate signal bleed into other wires for accurate detection.

Finally a Quiet quantum ends the packet, providing a period of time for the AGC in the probe to recover and optimally detect the next sync phase. Also, during this time period the probe can perform other processing such as analyzing or displaying results of the last tone packet, checking for switch changes, battery level testing, etc.

In the preferred embodiment of the invention, the quanta are each 10 milliseconds in length.

An advantage of employing a tone packet system such as the system disclosed herein is that the technician has the freedom to easily select any one of many test modes by changing the selection at the probe end of which particular packet quanta are to be detected, without requiring the technician to return to the toner's location and reconfigure the toner settings or connection.

Figure 3:
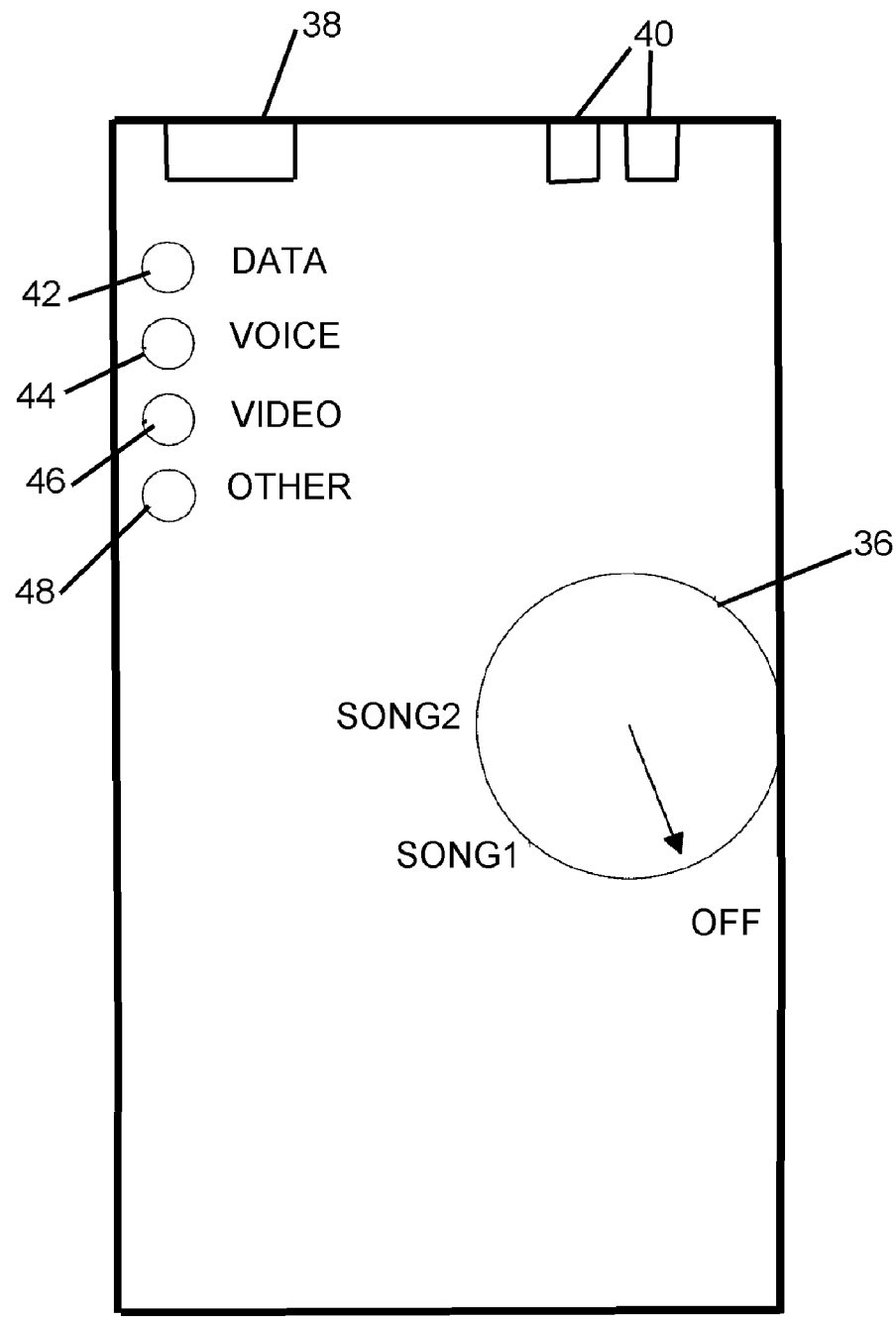
FIG. 3 is a schematic representation of a toner module in accordance with the invention.
Figure 4:
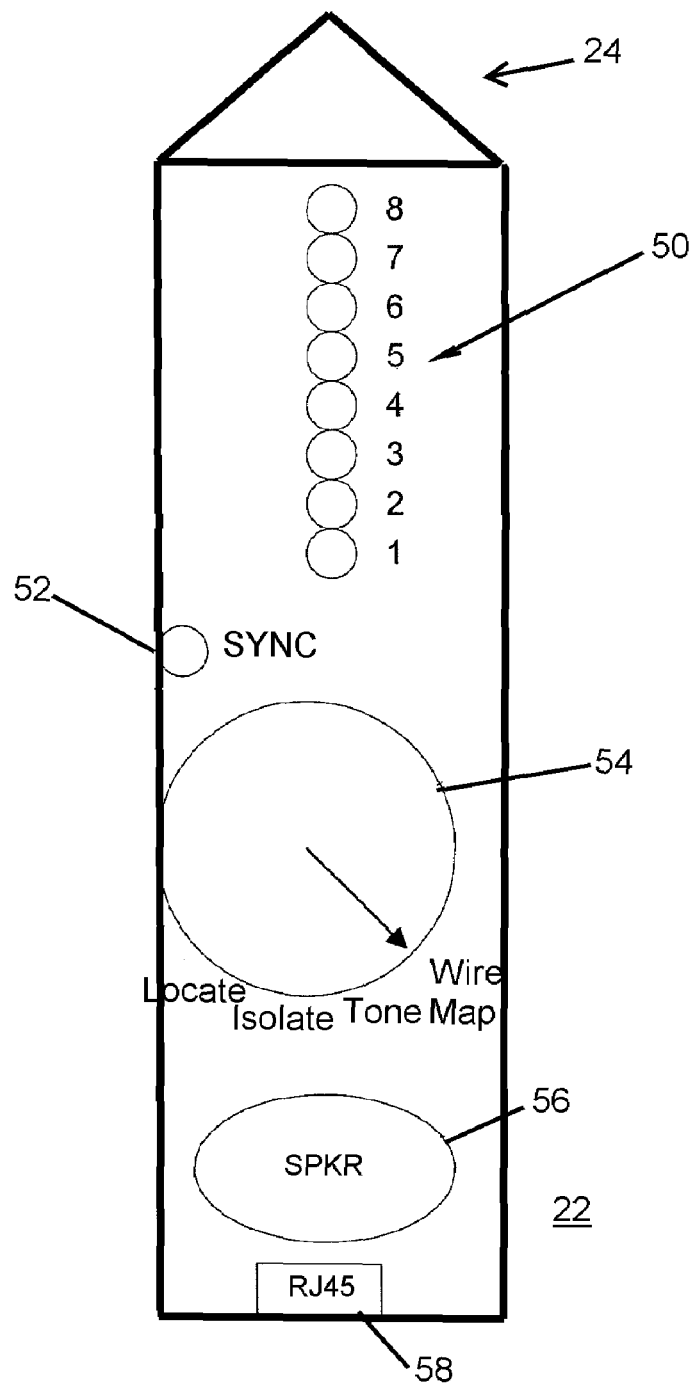
FIG. 4 is a schematic representation of a probe module in accordance with the invention.
Figure 5:
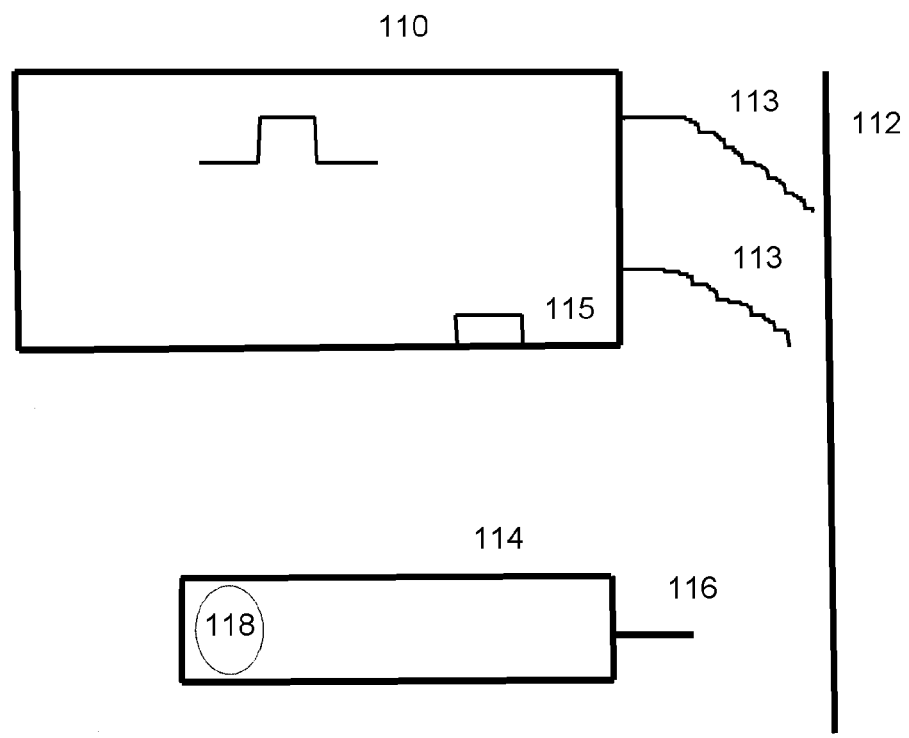
FIG. 5 is a diagram of a prior art toner/probe system.

Referring now to FIG. 3 and FIG. 4, which are schematic representations of the physical configuration of the toner 10 and probe 22, the toner is implemented as a hand held instrument and includes a selector switch 36, suitably a rotary selector in the illustrated embodiment, for OFF, SONG1 and SONG2 for selecting the particular song as discussed above. Of course, more than 2 songs can be provided in other embodiments. The toner includes both an RJ45 type female connector 38 for attaching to typical network cables as well as two banana jacks 40 to enable connection to non RJ-45 cables using alligator clip, banana plug leads, or the like. Visual indicators 42-48 to show the type of service to which the device is connected (e.g. voice 44, data 42 or video 46 (telephone, Ethernet or video) an can be provided in a form such as LEDs. An "Other" or unknown indicator 48 can be supplied to indicate that the particular type of cable service is not recognized. The device is suitably battery powered to enhance portability, but can also be configured to be powered from an external supply.

A schematic probe representation is shown by FIG. 4, wherein the probe may employ an elongate shape having the antenna 24 configured at one end. A series of visual signal strength indicators 50 are placed along a length of the body of the probe in the form of 8 LEDs to illustrate relative signal strength. The configuration can be driven to provide a 1 in 256 sensitivity by driving the LEDs in a binary representation of 0 to 255. A sync indicator 52, again in the form of an LED, is provided to show that the probe has successfully synchronized with the tone packet.

A selector 54, which is a rotary selector switch in the preferred embodiment, is provided on the probe to enable selection of which operation mode is to be employed. In the particular embodiment the selection options are Wire Map mode (which selects the wire map function discussed above in connection with the tone packet configuration), Tone mode for enabling operation in a prior art toner mode, Isolate near cable mode (corresponding to the NearMode quanta) for precise identification of a toned cable, and Locate mega tone mode (corresponding to the Mega quanta discussed above) for detecting the maximum radiation mode of the cable packet quanta to enable maximum range and detection when a cable is terminated into a network device such as a switch. When in this mode, which can also be called a rough locate mode, the line of 8 LEDs are driven to indicate whether the signal is getting stronger or weaker. If the signal is getting stronger (that is, if the probe is getting closer to the toned cable), the LEDs are illuminated in a pattern so as to appear to sweep toward the antenna tip of the probe. Alternatively, if the signal is getting weaker, the LEDs are illuminated to appear to sweep away from the antenna tip of the probe, providing a technician with an idea of whether the technician is getting closer or farther from the toned cable.

The probe further includes a speaker 56 which is configured to emit an audio signal to indicate that tone packets are detected. However, unlike the prior art which merely detected and reproduced the actual signal frequency of the applied tone, the audio produce by the speaker on the inventive probe can be configured in any manner. Suitably a different audio program is produced depending on whether song 1 or song 2 (discussed above) is detected. An RJ45 type connector 58 is also provided to the probe, for connecting a cable for use in wiremap mode to detect the wiring configuration in conjunction with the tone packet wiremap quanta. Cable wiring errors (or lack thereof) can be determined.

The various operations described above for the toner and probe are governed by the respective microprocessors in the toner and the probe.

Use of the 455 Khz carrier provides advantages such as: immunity to 60 Hz noise and fluorescent lighting noise; since the probe is not producing the same audible frequency as it is detecting, the problem of probe feedback that is common in prior art toner/probe systems is eliminated. Further, the probe gain is split between the 455 Khz and 1 Khz paths, providing a more stable system.

The invention solve the problem in toning cable where sometimes the signal is too strong and causes bleed and other times the signal is too weak due to termination by network equipment, avoiding a technician having many wasted hours, either from mis-identifying cable due to bleed, or from not being able to locate the cable due to a weak signal.

Accordingly an improved toner/probe system is provided.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

What is claimed is:

1. A toner/probe system, comprising:
   a toner adapted to generate and supply a tone packet to a cable under test, wherein said toner supplies a carrier signal as at least part of said tone packet; and
   wherein said tone packet comprises:
   a synchronization portion; and
   a data portion.

2. A toner/probe system according to claim 1 wherein said synchronization portion comprises a first and a second synchronization quanta.

3. A toner/probe system according to claim 1 wherein said data portion comprises a version quantum.

4. A toner/probe system according to claim 1 wherein said data portion comprises a song indication quantum to indicate a choice of a tone song which a sensor probe is to employ.

5. A toner/probe system according to claim 1 wherein said data portion comprises a quantum to minimize radiation from the cable under test.

6. A toner/probe system according to claim 5 wherein said quantum to minimize radiation from the cable under test comprises, wherein the cable under test comprises at least a pair of wires, driving an opposite polarity on each wire of said pair of wires.

7. A toner/probe system according to claim 1 wherein said data portion comprises a quantum to maximize radiation from the cable under test.

8. A toner/probe system according to claim 7 wherein said quantum to maximize radiation from the cable under test comprises, wherein the cable under test comprises at least four pairs of wires, applying an unbalanced signal of a first polarity to a first pair of said at least four pairs of wires and applying an opposite polarity signal to a second and third pair of said at least four pairs of wires and allowing a fourth pair of said at least four pairs of wires to float.

9. A toner/probe system according to claim 1 wherein said data portion comprises a quantum to enable a wiremap test.

10. A toner/probe system according to claim 1, wherein said tone packet further comprises a quiet quantum.

11. A method for locating a cable, comprising the steps of:
    applying a tone packet to a cable at one position thereof, wherein said tone packet employs a carrier signal as at least part of said tone packet; and
    employing a sensor responsive to said tone packet to locate said cable at another position thereof,
    wherein said applied tone packet comprises:
    a synchronization portion; and
    a data portion.

12. The method according to claim 11, wherein said data portion comprises plural portions providing different testing modes.

13. The method according to claim 12, wherein said testing modes are selected from the group consisting of:
    a cable isolate mode and a cable locate mode.

14. The method according to claim 12, wherein said testing mode comprises a wire pair test mode for location one or more wire pairs separately from other wire pairs.

15. The method according to claim 12, wherein said testing mode comprises a wire map mode.

16. The method according to claim 11, wherein said carrier signal is other than an audible frequency.

17. The method according to claim 11, wherein said carrier signal is turned on and off at an audio frequency rate.

18. The method according to claim 17 wherein said audio frequency rate is 1 Khz or 2 Khz.

19. The method according to claim 11, wherein said carrier signal frequency is other than a tone frequency.

20. A toner/probe system, comprising:
    a toner adapted to generate and supply a tone packet to a cable under test, wherein said toner supplies a carrier signal as at least part of said tone packet; and
    a probe adapted to detect said tone packet as propagated via the cable under test
    wherein said tone packet comprises:
    a synchronization portion; and
    a data portion.

21. A toner/probe system according to claim 20, wherein said data portion comprises plural portions providing different testing modes.

22. A toner/probe system according to claim 21, wherein said testing modes are selected from the group consisting of:
a cable isolate mode and a cable locate mode.

23. A toner/probe system according to claim 21, wherein said testing mode comprises a wire continuity test mode for location one or more wires separately from other wires.

24. A toner/probe system according to claim 21, wherein said testing mode comprises a wire map mode.

25. A toner/probe system according to claim 20 wherein said carrier signal is other than an audible frequency.

26. A toner/probe system according to claim 20 wherein said toner comprises a selector for selecting an operation mode.

27. A toner/probe system according to claim 20 wherein said toner comprises a song selector for selectively applying one of at least two distinguishable tone packets.

28. A toner/probe system according to claim 20, wherein said probe comprises a detector for detecting said tone packet and operatively responding to portions thereof.

29. A toner/probe system according to claim 20 wherein said carrier signal is turned on and off at an audio frequency rate.

30. A toner/probe system according to claim 29 wherein said audio frequency rate is 1 Khz or 2 Khz.

31. A toner/probe system according to claim 20 wherein said tone packet comprises plural quanta.

32. A toner/probe system according to claim 20 wherein said carrier signal frequency is other than a tone frequency.

33. A method for locating a cable, comprising the steps of:
applying a tone packet to a cable at one position thereof,
wherein said tone packet employs a carrier signal as at least part of said tone packet;
wherein said applied tone packet comprises:
a synchronization portion; and
data portion.

* * * * *